(12) United States Patent
Ranalli (10) Patent No.: US 7,298,493 B2
(45) Date of Patent: Nov. 20, 2007

(54) INTERFEROMETRIC OPTICAL ASSEMBLIES AND SYSTEMS INCLUDING INTERFEROMETRIC OPTICAL ASSEMBLIES

(75) Inventor: Eliseo Romolo Ranalli, Irvine, CA (US)

(73) Assignee: Zygo Corporation, Middlefield, CT (US)

( * ) Notice: Subject to any disclaimer, the term of this patent is extended or adjusted under 35 U.S.C. 154(b) by 8 days.

(21) Appl. No.: 11/170,936

(22) Filed: Jun. 30, 2005

(65) Prior Publication Data

US 2006/0001887 A1   Jan. 5, 2006

Related U.S. Application Data (60) Provisional application No. 60/584,299, filed on Jun. 30, 2004.

(51) Int. Cl.
*G01B 9/02* (2006.01)
(52) U.S. Cl. ......................... 356/493; 356/498
(58) Field of Classification Search ................ 356/487, 356/491–495, 482
See application file for complete search history.

(56) References Cited

U.S. PATENT DOCUMENTS

| | | |
|---|---|---|
| 4,606,638 A | 8/1986 | Sommargren |
| 4,684,828 A | 8/1987 | Sommargren |
| 4,685,803 A | 8/1987 | Sommargren |
| 4,688,940 A | 8/1987 | Sommargren et al. |
| 4,693,605 A | 9/1987 | Sommargren |
| 4,711,573 A | 12/1987 | Wijntjes et al. |
| 4,717,250 A | 1/1988 | Sommargren |
| 4,733,967 A | 3/1988 | Sommargren |
| 4,746,216 A | 5/1988 | Sommargren |
| 4,752,133 A | 6/1988 | Sommargren |
| 4,790,651 A | 12/1988 | Brown et al. |
| 4,802,764 A | 2/1989 | Young et al. |
| 4,802,765 A | 2/1989 | Young et al. |
| 4,859,066 A | 8/1989 | Sommargren |
| 4,881,816 A | 11/1989 | Zanoni |

(Continued)

FOREIGN PATENT DOCUMENTS

GB    2070276    9/1981

OTHER PUBLICATIONS

Badami et al. "Investigation of NonLinearity in High Accuracy Heterodyne Laser Interferometry." American Society for Precision Engineering, 1997 Proceedings, 16, pp. 153-156, 1997.

(Continued)

*Primary Examiner*—Hwa (Andrew) Lee
(74) *Attorney, Agent, or Firm*—Fish & Richardson P.C.

(57) ABSTRACT

In general, in one aspect, the invention features assemblies that include a first polarizing beam splitter positioned in the paths of a pair of initial beams, the polarizing beam splitter being configured to combine the pair of initial beams to form an input beam. The assemblies further include an interferometer positioned to receive the input beam and configured to produce an output beam that includes information about an optical path difference between the paths of two component beams derived from the input beam. A second polarizing beam splitter is positioned in the path of the output beam and configured to split the output beam into a pair of secondary output beams that each include information about the optical path difference between the component beam paths.

31 Claims, 7 Drawing Sheets

U.S. PATENT DOCUMENTS

| | | | |
|---|---|---|---|
| 4,950,078 A | 8/1990 | Sommargren | |
| 5,064,289 A | 11/1991 | Bockman | |
| 5,114,234 A | 5/1992 | Otsuka et al. | |
| 5,133,599 A | 7/1992 | Sommargren | |
| 5,187,543 A | 2/1993 | Ebert | |
| 5,331,400 A | 7/1994 | Wilkening et al. | |
| 5,408,318 A | 4/1995 | Slater | |
| 5,486,919 A * | 1/1996 | Tsuji et al. | 356/484 |
| 5,663,793 A | 9/1997 | de Groot | |
| 5,724,136 A | 3/1998 | Zanoni | |
| 5,757,160 A | 5/1998 | Kreuzer | |
| 5,764,361 A | 6/1998 | Kato et al. | |
| 5,801,832 A | 9/1998 | Van Der Brink | |
| 6,008,902 A | 12/1999 | Rinn | |
| 6,046,792 A | 4/2000 | Van Der Werf et al. | |
| 6,124,931 A | 9/2000 | Hill | |
| 6,134,007 A | 10/2000 | Naraki et al. | |
| 6,137,574 A | 10/2000 | Hill | |
| 6,181,420 B1 | 1/2001 | Badami et al. | |
| 6,198,574 B1 | 3/2001 | Hill | |
| 6,201,609 B1 | 3/2001 | Hill et al. | |
| 6,208,424 B1 | 3/2001 | de Groot | |
| 6,219,144 B1 | 4/2001 | Hill | |
| 6,236,507 B1 | 5/2001 | Hill et al. | |
| 6,246,481 B1 | 6/2001 | Hill | |
| 6,252,668 B1 | 6/2001 | Hill | |
| 6,271,923 B1 | 8/2001 | Hill | |
| 6,304,318 B1 | 10/2001 | Matsumoto | |
| 6,327,039 B1 | 12/2001 | de Groot et al. | |
| 6,330,065 B1 | 12/2001 | Hill | |
| 6,407,816 B1 | 6/2002 | Hill | |
| 6,417,927 B2 | 7/2002 | de Groot | |
| 6,452,682 B2 * | 9/2002 | Hill et al. | 356/493 |
| 6,512,588 B1 | 1/2003 | Hill | |
| 6,525,825 B2 | 2/2003 | Hill | |
| 6,525,826 B2 | 2/2003 | Hill | |
| 6,529,279 B2 | 3/2003 | Hill | |
| 6,541,759 B1 | 4/2003 | Hill | |
| 6,552,804 B2 | 4/2003 | Hill | |
| 6,650,419 B2 | 11/2003 | Hill | |
| 6,727,992 B2 | 4/2004 | Hill | |
| 6,738,143 B2 | 5/2004 | Chu | |
| 6,747,744 B2 | 6/2004 | Hill | |
| 6,757,066 B2 | 6/2004 | Hill | |
| 6,762,845 B2 | 7/2004 | Hill | |
| 6,791,693 B2 | 9/2004 | Hill | |
| 6,795,197 B2 | 9/2004 | Hill | |
| 6,806,961 B2 * | 10/2004 | Hill | 356/487 |
| 6,806,962 B2 | 10/2004 | Hill | |
| 6,819,434 B2 | 11/2004 | Hill | |
| 6,836,335 B2 | 12/2004 | Hill | |
| 6,839,141 B2 | 1/2005 | Hill | |
| 6,867,867 B2 | 3/2005 | Hill | |
| 6,891,624 B2 | 5/2005 | Hill | |
| 6,912,054 B2 | 6/2005 | Hill | |
| 2001/0035959 A1 | 11/2001 | Hill | |
| 2002/0089671 A1 | 7/2002 | Hill | |
| 2003/0035112 A1 * | 2/2003 | Nevis | 356/487 |
| 2003/0090675 A1 | 5/2003 | Fujiwara | |
| 2004/0046965 A1 | 3/2004 | Hill | |
| 2005/0134862 A1 | 6/2005 | Hill | |

OTHER PUBLICATIONS

Bennett, S.J. . "A Double-Passed Michelson Interferometer." Optics Communications, 4:6, pp. 428-430, 1972.

Bobroff, Norman. "Recent advances in displacement measuring interferometry." Meas. Sci. Technol. 4, pp. 907-926, 1993.

Bobroff, Norman. "Residual errors in laser interferometry from air turbulence and nonlinearity." Applied Optics, 26:13, pp. 2676-2686, 1987.

Hines et al. Sub-Nonometer Laser Metrology—Some Techniques and Models. ESO Conference on High-Resolution Imaging by Interferometry II, pp. 1195-1204, 1991.

Mauer, Paul. "Phase Compensation of Total Internal Reflection." J. Opt. Soc. Am., 56:9, pp. 1219-1221, 1966/.

Oka et al. "Polarization heterodyne interferometry using another local oscillator beam." Optics Communications, 92, pp. 1-5, 1992.

Player, M.A. "Polarization properties of a cube-corner reflector." J. Mod. Opt., 35:11, pp. 1813-1820, 1988.

Wu et al. "Analytical modeling of the periodic nonlinearity in heterodyne interferometry." Applied Optics, 37:28, pp. 6696-6700, 1998.

* cited by examiner

INTERFEROMETRIC OPTICAL ASSEMBLIES AND SYSTEMS INCLUDING INTERFEROMETRIC OPTICAL ASSEMBLIES

CROSS-REFERENCE TO RELATED APPLICATIONS

This application claims priority under 35 USC 119(e)(1) to Provisional Patent Application No. 60/584,299, entitled "OPTICAL ASSEMBLY," filed on Jun. 30, 2004, the entire contents of which are hereby incorporated by reference.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

Generally, the measurement and reference beams are derived from a common source. Typically, the source delivers an input beam to the interferometer, which splits the input beam into the measurement and reference beams. In some embodiments, one or more optical waveguides are used to deliver the input beam, or components of the input beam, from the light source to the interferometer.

In many applications, the measurement and reference beams have orthogonal polarizations. In certain applications, the measurement and reference beams can have different frequencies as well. The different frequencies can be produced, for example, by laser Zeeman splitting, by acousto-optical modulation, or internal to the laser using birefringent elements or the like. The orthogonal polarizations allow a polarization beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to and from a stage that includes the measurement object. In other words, the phase $\Phi$, ideally, is directly proportional to L, and can be expressed as $$\Phi = 2pkL \cos^2\theta \qquad (1)$$

for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized.

SUMMARY

In certain embodiments, the invention features interferometry systems that include an interferometer, an input optical assembly and an output assembly. The input optical assembly combines two substantially orthogonally polarized component beams to form an input beam for the interferometer. The output assembly splits the interferometer's output beam into a pair of secondary output beams that both include interferometric information. Typically, the input and output assemblies include a polarization sensitive prism, such as a Wollaston prism, to combine a pair of component beams into a single input beam, or to split a single output beam into a pair of secondary output beams.

In addition, the input and/or output assemblies can include a pair of optical fibers spaced a predetermined distance apart and a lens (e.g., a diffraction limited lens). For the input assembly, the component beams are delivered from a source through the optical fibers and the lens is positioned to collimate the component beams before they are combined by the polarization sensitive prism to form the input beam. For the output assembly, the lens is positioned so that it focuses the secondary output beams to respective foci. A pair of optical fibers are positioned at the respective foci so that the beams couple into the fibers' cores Arrays of distance-measuring interferometers, complete with redundant optical reference/measurement signals can be realized using the assemblies.

In general, in a first aspect, the invention features assemblies that include a first polarizing beam splitter positioned in the paths of a pair of initial beams, the polarizing beam splitter being configured to combine the pair of initial beams to form an input beam. The assemblies further include an interferometer positioned to receive the input beam and configured to produce an output beam that includes information about an optical path difference between the paths of two component beams derived from the input beam. A second polarizing beam splitter is positioned in the path of the output beam and configured to split the output beam into a pair of secondary output beams that each include information about the optical path difference between the component beam paths.

Embodiments of the assemblies can include one or more of the following features and/or features of other aspects. For example, the interferometer can be configured so that a first of the component beams has a first polarization state and a second component beam has a second polarization state substantially orthogonal to the first polarization state. The second polarizing beam splitter can be configured so that the secondary output beams each comprise a portion of the first and second polarization states. The secondary output beams can each include a substantially equal portion of the first and second polarization states. The pair of initial beams can be polarized substantially orthogonally to each other. One of the initial beams can have the first polarization state and the other initial beam can have the second polarization state. The first and second polarizing beam splitters can each include a pair of orthogonal principle axes and the orientation of the principle axes of the first polarizing beam splitter are substantially parallel to the first and second respective polarization states in the input beam while the orientation of the principle axes of the second polarizing beam splitter are substantially non-parallel to the first and second respective polarization states in the output beam. The principle axes of the second polarizing beam splitter can be oriented at about 45° with respect to the first polarization state in the output beam.

The first and second polarizing beam splitters can each include a respective prism (e.g., a Wollaston prism). The propagation directions of both of the secondary output beams can be different from the propagation direction of the output beam. The paths of the pair of secondary output beams can diverge at an angle of about 45° or less (e.g., about 30° or less, about 20° or less, about 15° or less, about 10° or less).

The information about the optical path difference included in each secondary output beam can include an interferometric phase where the interferometric phases of the secondary output beams have a phase difference of about $\pi$.

The assemblies can include a lens positioned to collimate the initial beams and direct them towards the first polarizing beam splitter. In some embodiments, the assemblies further include a light source configured provide the initial beams to the lens. The assemblies can include a pair of optical waveguides each positioned to receive a respective polarization component of light emitted from the light source and deliver that component to the lens as one of the initial beams. An end of each of the optical waveguides can be positioned in a focal plane of the lens. The light source can be a homodyne or heterodyne light source.

The assemblies can include a lens positioned to receive the pair of secondary output beams and configured to focus the secondary output beams to respective foci. The assemblies can also include a pair of optical waveguides being positioned relative to the lens to respectively receive one of the focused secondary output beams.

The interferometer can be a single pass interferometer or a multiple pass interferometer, such as a double pass interferometer (e.g., a high stability plane mirror interferometer). The path of one of the component beams can contact a measurement object remote from the interferometer. The assemblies can further include an electronic controller configured to determine information about the measurement object based on the intensities of the secondary output beams. The electronic controller can determine information based on a difference between the intensities of the secondary output beams.

In general, in another aspect, the invention features assemblies that include a lens positioned in the paths of a pair of initial beams and configured to collimate the initial beams and direct them towards a first polarizing beam splitter, the first polarizing beam splitter positioned to receive the collimated pair of initial beams and configured to combine the collimated pair of initial beams to form an input beam, an interferometer positioned to receive the input beam and configured to produce an output beam that includes information about an optical path difference between the paths of two component beams derived from the input beam, and a second polarizing beam splitter positioned in the path of the output beam and configured to split the output beam into a pair of secondary output beams. Embodiments of the assemblies can include features of other aspects.

In general, in another aspect, the invention features assemblies that include a first polarizing beam splitter positioned in the paths of a pair of initial beams, the polarizing beam splitter being configured to combine the pair of initial beams to form an input beam, an interferometer positioned to receive the input beam and configured to produce an output beam that comprises information about an optical path difference between the paths of two component beams derived from the input beam, a second polarizing beam splitter positioned in the path of the output beam and configured to split the output beam into a pair of secondary output beams, and a lens positioned to receive the pair of secondary output beams and configured to focus the secondary output beams to respective foci. Embodiments of the assemblies can include features of other aspects.

In general, in another aspect, the invention features assemblies that include an interferometer configured to produce an output beam that comprises information about an optical path difference between two component beam paths, a polarizing beam splitter positioned in the path of the output beam and configured to split the output beam into a pair of secondary output beams that each include information (e.g., interferometric phase information) about the optical path difference between the component beam paths, and a lens positioned to receive the pair of secondary output beams and configured to focus the secondary output beams to respective foci.

Embodiments of the assemblies can include one or more of the following features and/or features of other aspects. For example, the polarizing beam splitter can include a prism, e.g., a Wollaston prism. The propagation directions of both of the secondary output beams can be different from the propagating direction of the output beam. The paths of the pair of secondary output beams can diverge at an angle of about 45° or less. The pair of secondary output beams can partially overlap as they exit the polarizing beam splitter. The interferometric phases of the secondary output beams have a phase difference of about $\pi$.

The assemblies can further include a pair of optical waveguides being positioned relative to the lens to respectively receive one of the focused secondary output beams. The path of one of the component beams can contact a measurement object remote from the interferometer. The component beams can be polarized substantially orthogonally to each other. In other words, the component beams have sufficiently orthogonal polarization states so that when they are mixed they produce a readily detectable interference signal. Alternatively, or additionally, the component beams have different frequencies In general, in a further aspect, the invention features assemblies that include an interferometer configured to produce an output beam that comprises information about an optical path difference between two component beam paths, and a polarizing beam splitter positioned in the path of the output beam and configured to split the output beam into a pair of secondary output beams and direct each of the secondary output beams on different paths that diverge at an angle of about 45° or less, wherein each secondary output beam include is information about the optical path difference between the component beam paths. Embodiments of the assemblies can include one or more features of other aspects.

In general, in a further aspect, the invention features assemblies that include a lens positioned to receive two orthogonally-polarized beams propagating along different paths and collimate both beams, a polarizing beam splitter positioned in the paths of the collimated beams and configured to combine the two collimated beams to form an input beam, an interferometer positioned to receive the input beam and configured split the input beam into two component beams and produce an output beam that includes information about an optical path difference between the two component beam paths.

Embodiments of the assemblies can include one or more of the following features and/or features of other aspects. For example, the assemblies can include a light source configured provide the orthogonally-polarized beams to the lens. In some embodiments, the assemblies include a pair of optical waveguides each positioned to receive a respective polarization component of light emitted from the light source and deliver that component to the lens as one of the orthogonally-polarized beams. An end of each of the optical waveguides can be positioned in a focal plane of the lens. The light source can be configured to emit light having orthogonally-polarized components at different frequencies.

In general, in a further aspect, the invention features assemblies that include a polarizing beam splitter positioned in the paths of a pair beams that converge at an angle of about 45° or less, the polarizing beam splitter being configured to combine the two collimated beams to form an input beam, and an interferometer positioned to receive the input beam and configured split the input beam into two component beams and produce an output beam that comprises information about an optical path difference between the two component beam paths. Embodiments of the assemblies can include one or more features of other aspects.

In another aspect, the invention features lithography systems for use in fabricating integrated circuits on a wafer. The systems include a stage for supporting the wafer, an illumination system for imaging spatially patterned radiation onto the wafer, a positioning system for adjusting the position of the stage relative to the imaged radiation, and an interferometry system including an assembly of a foregoing aspect for monitoring the position of the wafer relative to the imaged radiation.

In another aspect, the invention features lithography systems for use in fabricating integrated circuits on a wafer that include a stage for supporting the wafer, and an illumination system including a radiation source, a mask, a positioning system, a lens assembly, and an interferometry system that includes an assembly of a foregoing aspect, wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

In a further aspect, the invention features beam writing systems for use in fabricating a lithography mask that include a source providing a write beam to pattern a substrate, a stage supporting the substrate, a beam directing assembly for delivering the write beam to the substrate, a positioning system for positioning the stage and beam directing assembly relative one another, and an interferometry system including an assembly of a foregoing aspect for monitoring the position of the stage relative to the beam directing assembly.

In another aspect, the invention features a methods for fabricating integrated circuits that include a foregoing lithography system.

In another aspect, the invention features methods for fabricating integrated circuits, the method comprising using the foregoing beam writing system.

In a further aspect, the invention features methods for fabricating a lithography mask that include directing a write beam to a substrate to pattern the substrate, positioning the substrate relative to the write beam, and monitoring the position of the substrate relative to the write beam using an interferometry system that include an assembly of a foregoing aspect.

Among other advantages, embodiments of the assemblies can provide a low cost means of developing overlapping beams of relatively large diameter and of two different optical frequencies in orthogonal linear polarization states.

Embodiments can provide a high efficiency and low cost means of generating an optical reference signal that enables removal of differential phase shift that occurs when two separate frequencies are delivered over two separate fibers (when, for example, temperature changes occur that are not common mode to the fibers).

Embodiments can provide a means of generating dual interfered outputs, both for reference and measurement. This can be beneficial in at least two ways: (1) When redundancy is a requirement, such as in space borne interferometers, optical assemblies described herein can be more efficient than traditional beam splitter; and (2) When signal to noise is an issue due to low intensity, two separate signals can be used to improve the signal-to-noise ratio (SNR) of an electrical reference signal delivered to a phase meter by a factor of root two by directing two output beams onto two separate photodetectors and combining the electrical output signals of the two detectors.

In some embodiments, assemblies can be used to generate coaxial Gaussian beams from separate fiber inputs (e.g., polarization maintaining) and the generation of any number of output beam pairs and/or reference beam pairs.

Assemblies described herein can be used to provide reference beams from which an optical reference signal can be derived. A desired feature associated with high accuracy displacement-measuring interferometers is to provide an optical reference signal, which enables removal of a differential phase shift that may occur when two separate modulation frequencies (e.g., one for each polarization) are delivered over two separate fibers. For example, such a reference can be useful to account for temperature variations that are not common to both the input fibers.

Furthermore, embodiments can provide a path to significant cost reduction for an array of interferometers, by modularizing optical assemblies (e.g., modularization of a dual fiber/lens/Wollaston assembly, as well as a polarizing beam splitter, which can be realized in a common-rail form). A convenient by-product of a common-rail approach is that once the eigenpolarizations are aligned between a launch assembly and any single interferometer, they are automatically aligned for the entire array.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
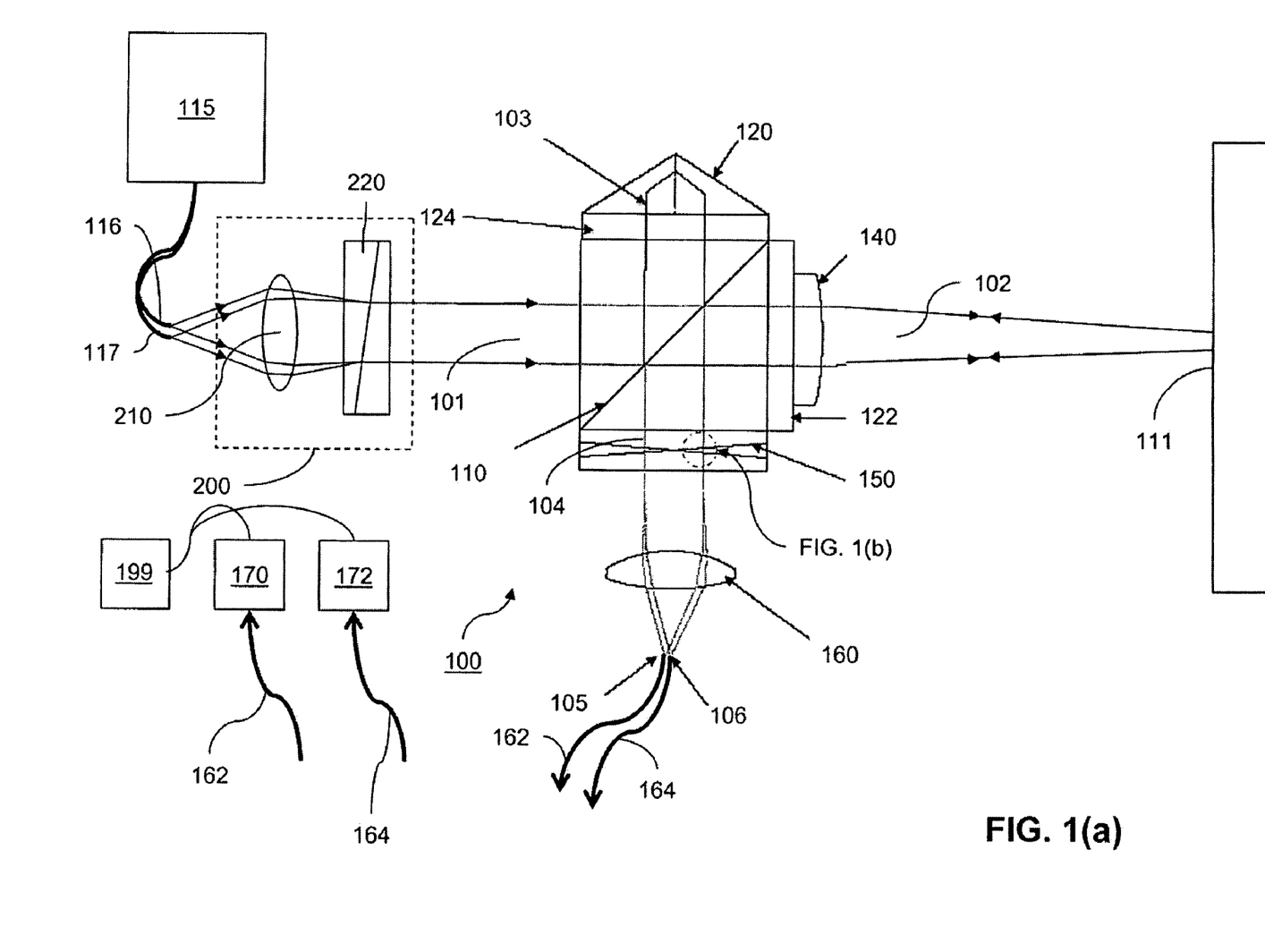
FIG. 1(a) is a diagrammatic view of an interferometry system that includes a Wollaston prism in the output beam path.

Referring to FIG. 1(a), an interferometry system 100 is positioned relative to a plane mirror measurement object 111 and configured to produce an output beam that includes information about an optical path length difference between a reference beam and a measurement beam that reflects from measurement object 111. Interferometry system 100 includes a polarizing beam splitter 110, a retroreflector 120, quarter wave plates 122 and 124, and a lens 140 (e.g., a single lens element). Interferometry system 100 also includes an output assembly composed of a Wollaston prism 150, and output lens, and a pair of optical fibers 162 and 164.

A remote light source 115 delivers two component beams to the interferometer via two optical fibers 116 and 117. An input assembly 200 combines the component beams to form a single input beam 101 from the two component beams. The component beams are substantially orthogonally-polarized. Light source 115 can be a homodyne or heterodyne light source.

Figure 2:
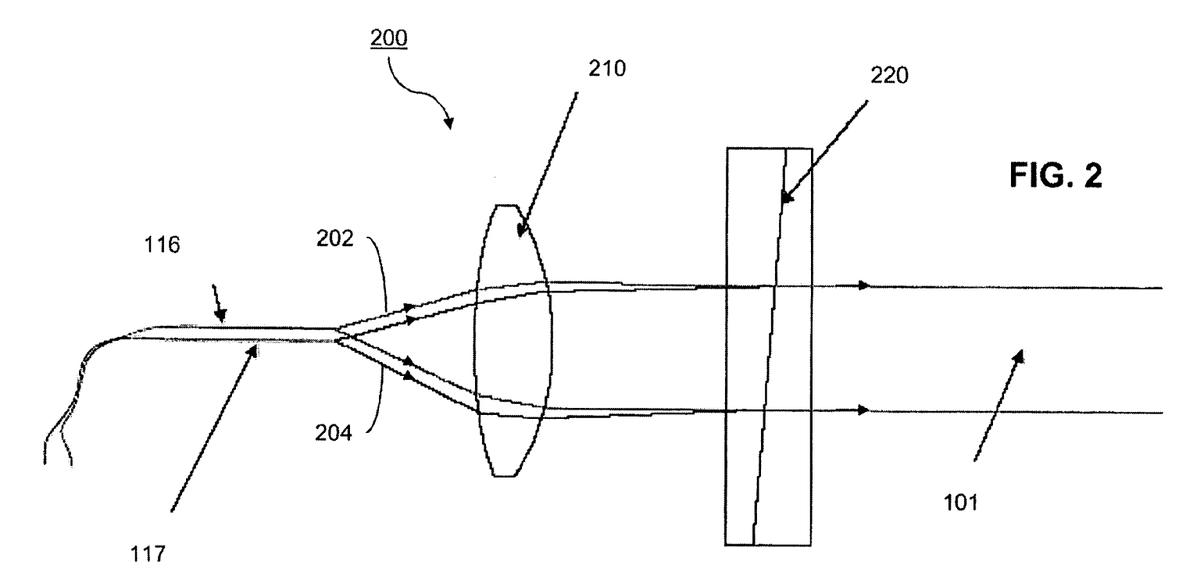
FIG. 2 is a diagrammatic view of the input optical assembly shown in FIG. 1(a).

Referring now to FIG. 2, input assembly 200 includes a lens 210 and Wollaston prism 220. Lens 210 and Wollaston prism 220 are positioned relative to optical fibers 116 and 117 to collimate and overlap orthogonally-polarized component beams 202 and 204 exiting the ends of the respective fibers. Lens 210 collimates the diverging beams that exit the fibers, and lens 210 and Wollaston prism 220 are arranged so that the common pupil for the collimated beams is at the diagonal of the prism. Furthermore, the focal length of the lens is chosen so that a mutual Gaussian radius of the overlapped collimated beams is the product of the fiber numerical aperture (NA) and the focal length (FL). The product of the fiber spacing and FL is chosen to match the Wollaston prism divergence. With this arrangement, the divergence angle of the Wollaston prism matches the convergence angle between the orthogonally-polarized, collimated beams. As a result, Wollaston prism 220 transmits the orthogonally polarized beams along a common path, providing single input beam 101 to the interferometer.

Referring again to FIG. 1(a), polarizing beam splitter 110 splits input beam 101 into measurement beam 102 and reference beam 103. Light source 115 is a heterodyne source, producing a beam with orthogonally polarized components at different frequencies. Measurement beam 102 is formed from the component of input beam 101 that is transmitted by polarizing beam splitter 110 (e.g., the p-polarized component of beam 101). Measurement beam 102 exits assembly 100 through lens 140, reflects from measurement object 111, and returns to assembly 100 along the same path. The measurement beam passes through quarter wave plate 122 twice on its round trip to and from the measurement object, causing the measurement beam to be reflected by beam splitter 110 after its pass to the measurement object.

Reference beam 103 is the component of input beam 101 that is reflected by polarizing beam splitter 110 (e.g., the s-polarized component of beam 101). Reference beam 103 reflects from retroreflector 120 and returns to beam splitter 110. The reference beam's double pass through quarter wave plate 124 results in the reflected reference beam being transmitted by polarizing beam splitter 110.

The reflected measurement and reference beams exit beam splitter 110 along a common path as output beam 104. Wollaston prism 150 is positioned in the path of output beam 104 and splits output beam 104 into two secondary output beams having orthogonal polarization states that exit the Wollaston prism along divergent paths. Lens 160 focuses both secondary output beams to respective foci 105 and 106 in the focal plane of lens 160. Optical fibers 162 and 164 are positioned at or near foci 105 and 106, respectively, so that beam energy is coupled into the fiber cores. The optical fibers guide optical signals corresponding to the secondary output beams to a pair of remote detection assemblies 170 and 172, which monitor the intensity of the optical signals guided by the fibers. Detection assemblies 170 and 172 are in communication with an electronic controller 199, such as a computer or dedicated electronics consul. Electronic controller 199 receives signals from the detection assemblies and processes the signals to determine information about measurement object 111 (e.g., to determine information about changes in the relative position between the interferometer and the measurement object.

The Wollaston prism is oriented so that both secondary output beams include components from both the reference and measurement beams (e.g., both s-polarized light and p-polarized light). In some embodiments, the Wollaston prism is oriented to sample substantially equal components of the reference and measurement beams. For example, the principle axes of the birefringent elements composing the prism oriented at about 45° with respect to the plane of FIG. 1(a). In contrast, the principle axes of Wollaston prism 220 are oriented parallel and perpendicular to the plane of FIG. 1(a).

Because both secondary output beams include a component corresponding to the measurement beam and a component corresponding to the reference beam they can provide a redundant measurement of the phase of the interference signal corresponding to the optical path difference between the measurement and reference beams. However, because they are orthogonally polarized, the redundant phase measurements will be separated by $\pi$.

Figure 1B:
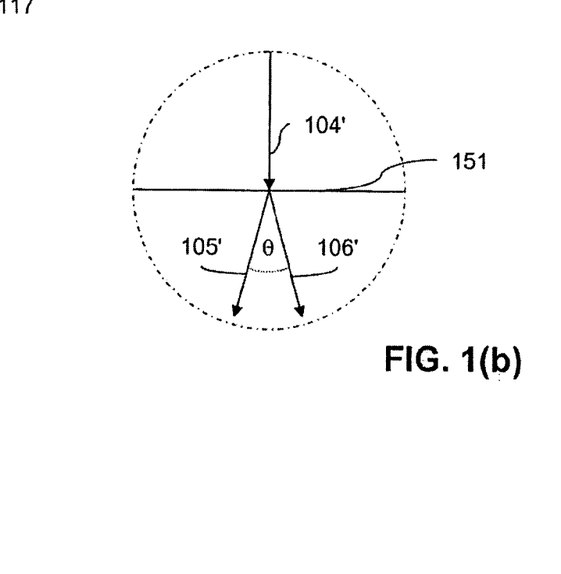
FIG. 1(b) is a diagrammatic view of ray paths within the Wollaston prism shown in FIG. 1(a).

Both secondary output beams propagate in different directions relative to the direction of output beam 104. Furthermore, the paths of the secondary reference beams diverge from each other. The divergence of the secondary output beams is illustrated in FIG. 1(b) by output beam ray 104', which splits at the interface 151 in the Wollaston prism to form secondary output beam rays 105' and 106'. Generally, their divergence, $\theta$, depends, at least in part, on the wedge angle of the elements composing the Wollaston prism. Typically, the secondary output beam paths diverge at angles greater than about 1-2°, but about 50° or less (e.g., about 45° or less, about 30° or less, about 15° or less, 10° or less).

In general, the type of optical fiber used in interferometry system 100 can vary. In certain embodiments, the optical fibers are single mode optical fibers. For example, for ease of alignment, multi-mode (MM) fibers can be used instead of single mode fibers, particularly when the optical assembly is used to couple beams into the fibers.

In some embodiments, the optical fibers are polarization maintaining optical fibers. For example, in embodiments where the fibers are used to direct orthogonally polarized components of an input beam to an interferometer, the fibers can be suitably-oriented polarization maintaining (PM) fibers (e.g., oriented to provide the component beams so that they are substantially orthogonally-polarized when emitted from the fibers)

In some embodiments, the two secondary output beams can be used to improve the accuracy of measurements made using interferometry system 100 compared to systems that utilize a single output beam. For example, the system can calculate a displacement of the measurement object from both secondary output beams and average the displacement measurements, thereby improving accuracy.

As another example, in certain embodiments, the signal from secondary output beams can be used to reduce certain errors in interferometry measurements made using interferometry system 100, such as cyclic errors. In a homodyne system, for example, the difference in the secondary output beam intensities is proportional to the cosine of the interferometric phase, $\Phi$, of the output beam. However, sources of errors that contribute equally to the intensity of both secondary output beams, such as cyclic errors (e.g., to first order), are therefore removed from difference values of the secondary beam intensities. Thus, the contribution of certain error sources can be reduced where an interference phase related to the optical path difference of the measurement and reference beams is determined from the difference of the secondary beam intensities. In certain embodiments, changes in the interference phase in the output beam can be monitored from the parameter $(I_1-I_2)/(I_1+I_2)$, where $I_1$ and $I_2$ refer to the intensity of secondary output beams 105 and 106, respectively.

In some embodiments, a number of Wollaston prism/lens assemblies can be used in an array of distance-measuring interferometers so that each interferometer produces a pair of output beams. For example, referring to FIG. 3, an interferometry system 300 includes four interferometer assemblies 310, 320, 330, and 340. An input assembly that includes a lens 358 and a Wollaston prism 352 provide an input beam 302 to the four interferometer assemblies. Beam splitters 362, 364, 366, and mirror 368 derive individual input beams from input beam 302 for interferometer assemblies 310, 320, 330, and 340, respectively.

Figure 3:
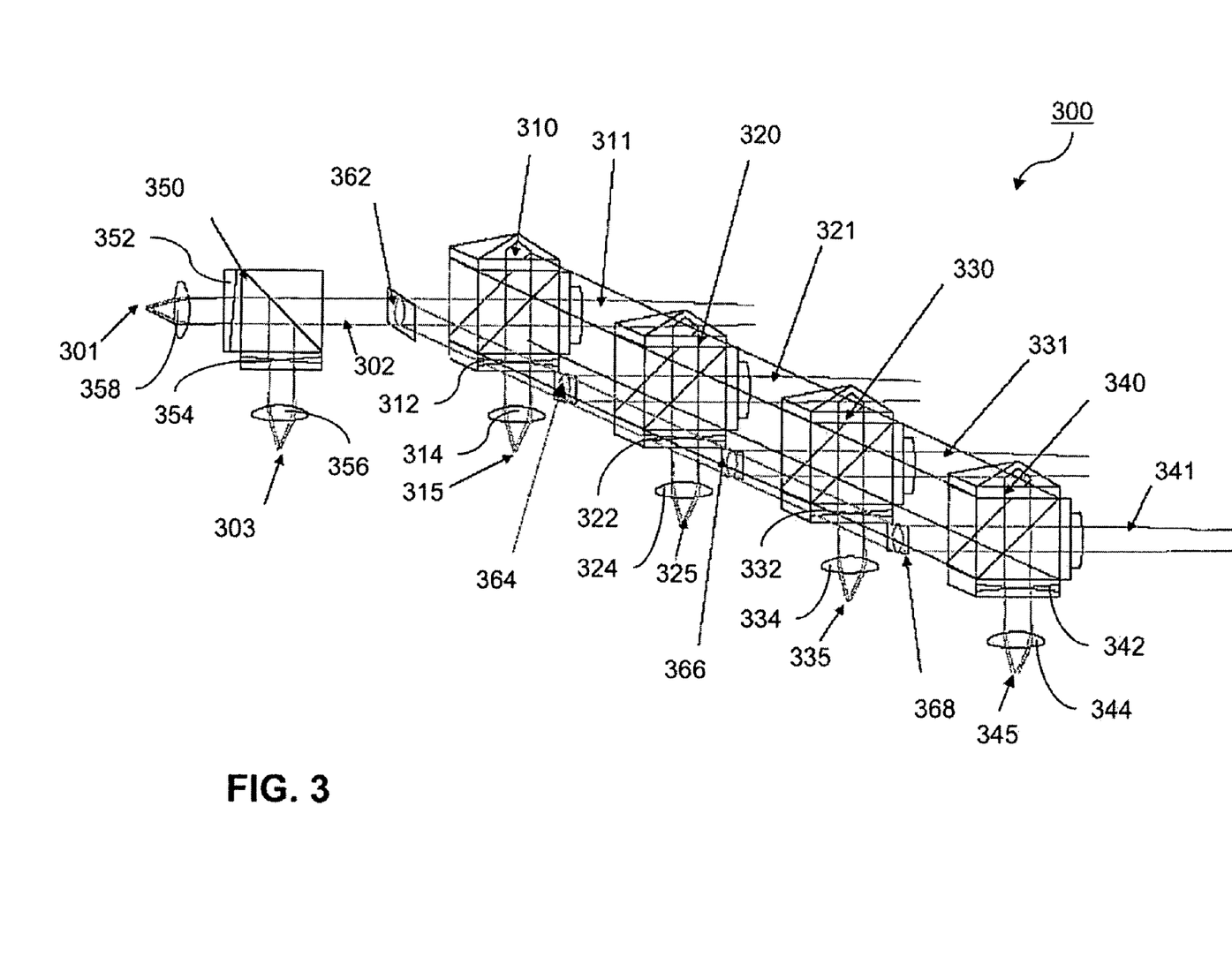
FIG. 3 is a perspective view of an assembly that includes four interferometers.

Interferometer assemblies 310, 320, 330, and 340, each split their respective input beam into a measurement beam and a reference beam. The measurement and reference beams are orthogonally polarized. The interferometers direct respective measurement beams 311, 321, 331, and 341, along measurement beam paths 311, 321, 331, and 341. One or more measurement objects (not shown) reflect the measurement beams back to the respective interferometer, which combines the reflected measurement beam with its reference beam to form an output beam.

Interferometer assemblies 310, 320, 330, and 340 each include a Wollaston prism and lens assembly in the paths of their respective output beams. Specifically, interferometer assembly 310, for example, includes Wollaston prism 312 and lens 314, which splits the interferometer assembly's output beam into two secondary output beams and focuses the secondary output beams to different foci at location 315. Correspondingly, Wollaston prisms 322, 332, and 342 are positioned adjacent interferometer assemblies 320, 330, and 340, respectively, and each split the interferometer assembly's output beam into two secondary output beams. Furthermore, lenses 324, 334, and 344 each focus respective secondary output beams to corresponding foci at locations 325, 335, and 345.

In addition, system 300 includes a beam splitter 350 (e.g., a non-polarizing beam splitter), which is positioned in the path of input beam 302, and splits off a portion of input beam 302 to generate a reference beam. The reference beam is subsequently split into two secondary reference beams by a Wollaston prism 354 positioned adjacent beam splitter 350. The secondary reference beams are focused by a lens 356 to respective foci at location 303. Wollaston prism 354 is oriented so that both secondary reference beams include polarization components of input beam 302 that form the reference and measurement beams in interferometers 310, 320, 330, and 340. Accordingly, the secondary reference beams provide redundant reference signals for the system.

Although not shown in FIG. 3, pairs of optical fibers are positioned at locations 301, 303, 315, 325, 335, and 345. The pair of optical fibers at location 301 deliver components of the input beam, while the pairs of optical fibers at the other locations are positioned to receive the focused secondary output or reference beams.

While the foregoing interferometry system includes four single pass interferometers, in other embodiments fewer or more interferometers can be used. Moreover, other types of interferometers can also be used, such as the interferometers described in U.S. patent application Ser. No. 10/351,708, entitled "MULTI-AXIS INTERFEROMETER," filed Jan. 27, 2003, by Henry A. Hill. More generally, examples of other forms of interferometers that may utilize the optical assemblies disclosed herein include both single and multiple pass interferometers, such as high-stability plane mirror interferometers (HSPMIs), and include passive interferometers, dynamic interferometers, and dispersion interferometers. Alternatively, or additionally, the optical assemblies can be applied to interferometers that monitor more than one degree of freedom, interferometers that monitor variations in angular orientation of a measurement object, and angular displacement interferometers that measure beam propagation direction. Examples of dynamic interferometers are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill. Examples of passive zero shear interferometers are described in U.S. patent application Ser. No. 10/207,314, entitled "PASSIVE ZERO SHEAR INTERFEROMETERS," filed Jul. 29, 2002, by Henry A. Hill. Examples of angular displacement interferometers are described in: U.S. patent application Ser. No. 10/226,591 entitled "DYNAMIC INTERFEROMETER CONTROLLING DIRECTION OF INPUT BEAM," filed Aug. 23, 2002; U.S. Provisional Application 60/314,345 filed Aug. 22, 2001 and entitled "PASSIVE ZERO SHEAR INTERFEROMETERS USING ANGLE SENSITIVE BEAM-SPLITTERS," both by Henry A. Hill, and U.S. patent application Ser. No. 10/272,034 entitled "INTERFEROMETERS FOR MEASURING CHANGES IN OPTICAL BEAM DIRECTION" and filed Oct. 15, 2002 by Henry A. Hill and Justin Kreuzer. Alternatively, or additionally, interferometry systems may include one or more differential angular displacement interferometers, examples of which are also described in U.S. patent application Ser. No. 10/272,034. Examples of interferometry systems for measuring more than one degree of freedom and for reducing beam shear are described in U.S. patent application Ser. No. 10/352,616 filed Jan. 28, 2003 and entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93-106 (1989). Examples of two-wavelength dispersion interferometers are described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

Still other forms of interferometers include those described in commonly owned U.S. patent application Ser. No. 10/351,707 filed Jan. 27, 2003 and entitled "MULTIPLE DEGREE OF FREEDOM INTERFEROMETER" and U.S. patent application Ser. No. 10/227,166 filed Aug. 23, 2002 and entitled "OPTICAL INTERFEROMETRY" by Henry A. Hill, the contents of said applications being incorporated herein by reference.

Furthermore, while the foregoing embodiments utilize a Wollaston prism to split or combine beams, and use a single lens to focus or collimate beams, other components can also be used to perform these functions. For example, in some embodiments, different types of polarizing beam splitter prisms can be used to split or combine beams, such as Rochon prisms, Senarmont prisms, or Glan-Thompson prisms.

In general, while the embodiments described above feature single lens focusing and/or collimating elements, beams can be focused or collimated using compound lenses (e.g., lenses that include more than one lens element), or some other focusing optic (e.g., a diffractive optical element).

The interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 4:
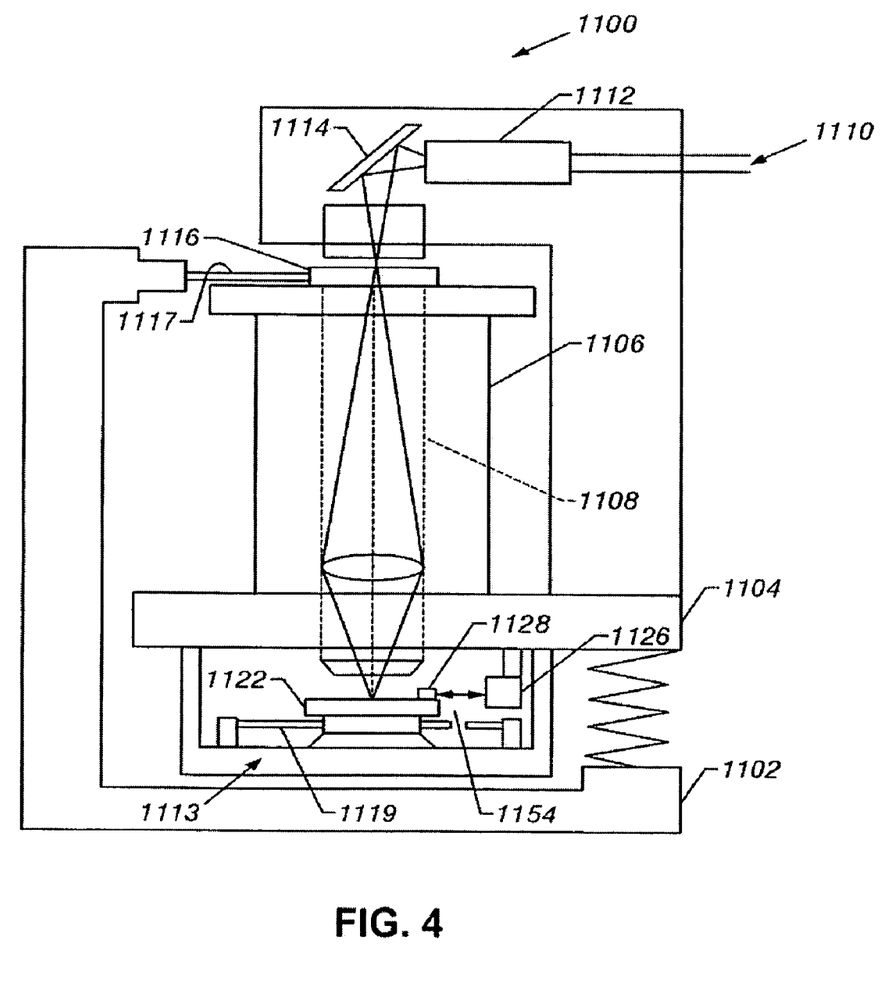
FIG. 4 is a schematic diagram of an embodiment of a lithography tool that includes an interferometer.

An example of a lithography scanner 1100 using an interferometry system 1126 is shown in FIG. 4. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 5A:
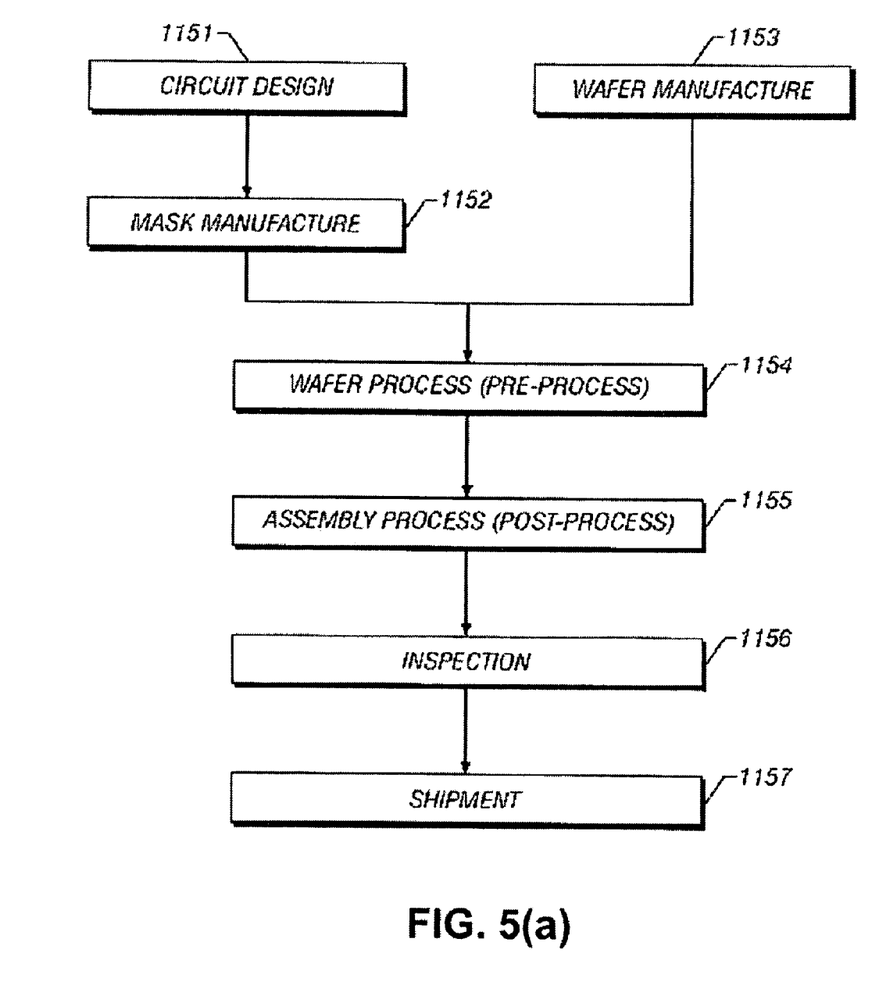
FIG. 5(a) and FIG. 5(b) are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 5*a* and 5*b*. FIG. 5*a* is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 5B:
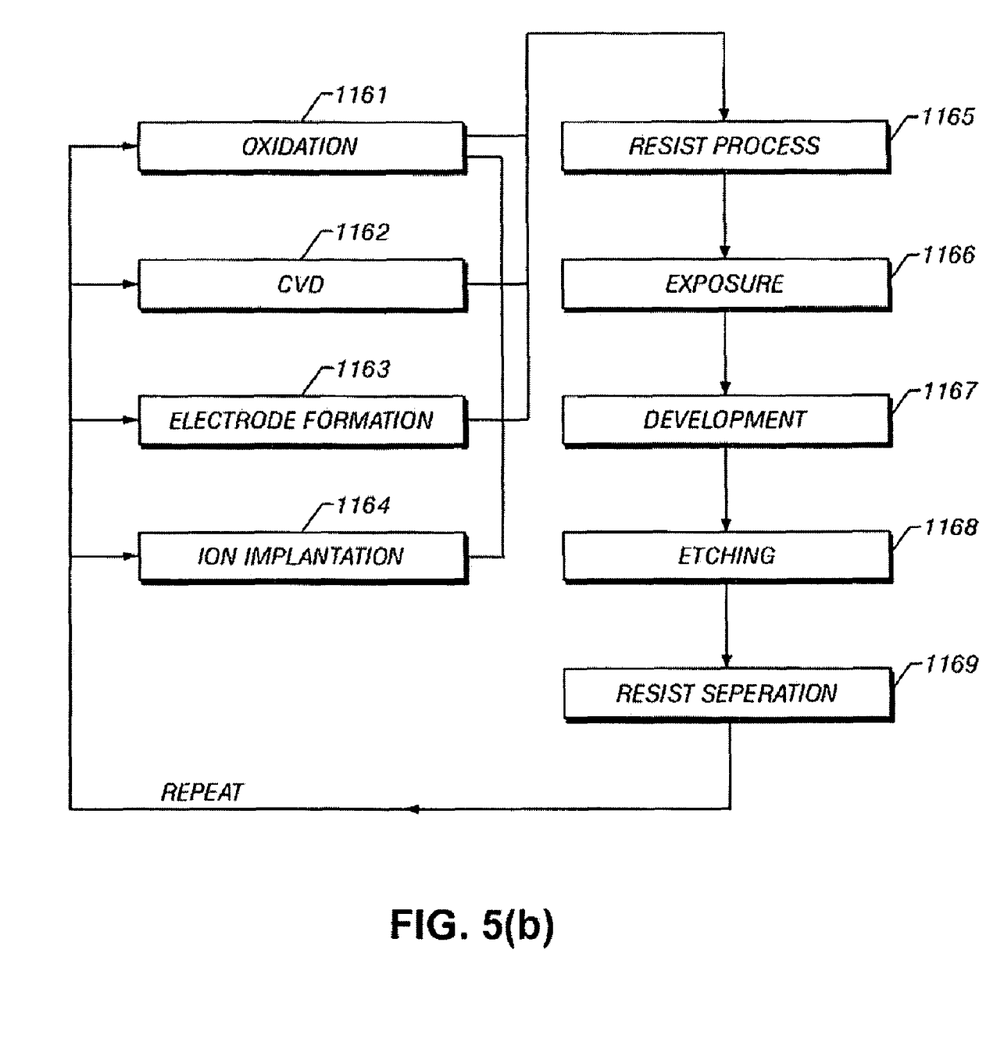

FIG. 5*b* is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 6:
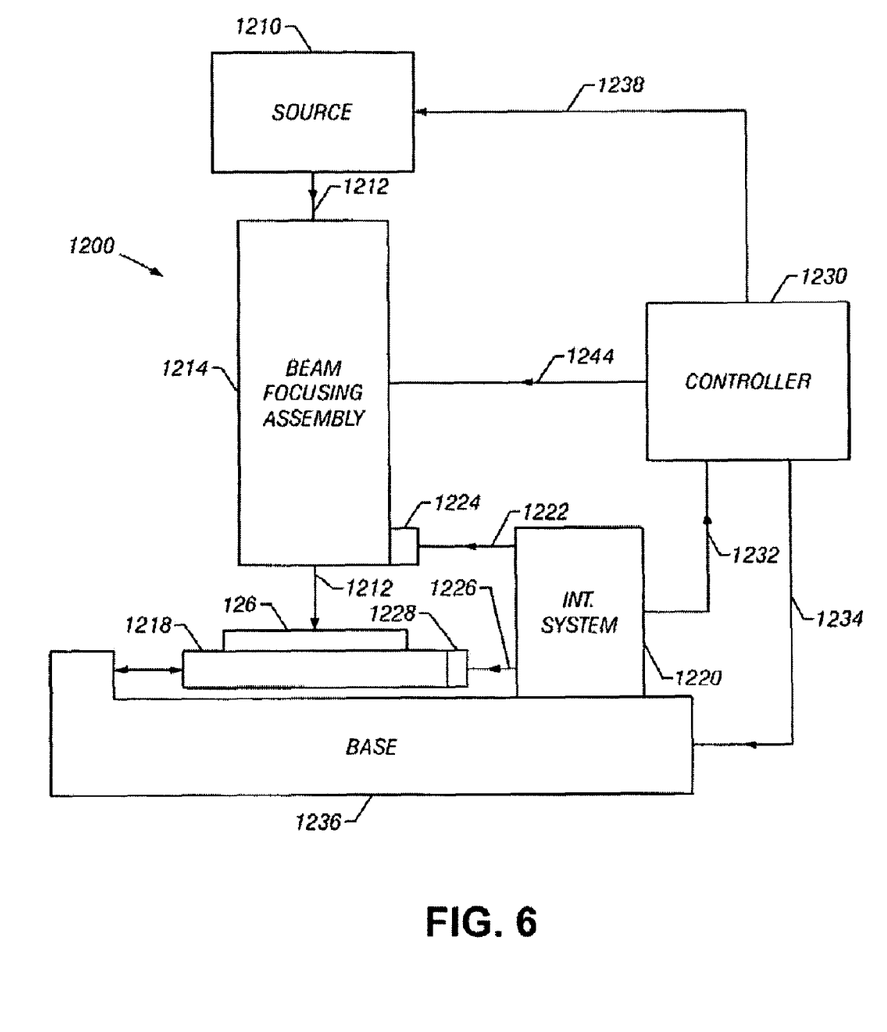
FIG. 6 is a schematic of a beam writing system that includes an interferometry system.

As an example, a schematic of a beam writing system 1200 is shown in FIG. 6. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention.

What is claimed is:

1. An assembly, comprising:
a first polarizing beam splitter positioned in the paths of a pair of initial beams, the polarizing beam splitter being configured to combine the pair of initial beams to form an input beam;
an interferometer positioned to receive the input beam and configured to produce an output beam that comprises information about an optical path difference between the paths of two component beams derived from the input beam; and
a second polarizing beam splitter positioned in the path of the output beam and configured to split the output beam into a pair of secondary output beams that each comprise information about the optical path difference between the component beam paths;
wherein the first and second polarizing beam splitters each comprise a respective Wollaston prism.

2. The assembly of claim 1, wherein the interferometer is configured so that a first of the component beams has a first polarization state and a second component beam has a second polarization state substantially orthogonal to the first polarization state.

3. The assembly of claim 2, wherein the second polarizing beam splitter is configured so that the secondary output beams each comprise a portion of the first and second polarization states.

4. The assembly of claim 3, wherein the secondary output beams each comprise a substantially equal portion of the first and second polarization states.

5. The assembly of claim 2, wherein the pair of initial beams are polarized substantially orthogonally to each other.

6. The assembly of claim 5, wherein one of the initial beams has the first polarization state and the other initial beam has the second polarization state.

7. The assembly of claim 2, wherein the first and second polarizing beam splitters each comprise a pair of orthogonal principle axes and the orientation of the principle axes of the first polarizing beam splitter are substantially parallel to the first and second respective polarization states in the input beam while the orientation of the principle axes of the second polarizing beam splitter are substantially non-parallel to the first and second respective polarization states in the output beam.

8. The assembly of claim 7, wherein the principle axes of the second polarizing beam splitter are oriented at about 45° with respect to the first polarization state in the output beam.

9. The assembly of claim 1, wherein the propagation directions of both of the secondary output beams are different from the propagation direction of the output beam.

10. The assembly of claim 9, wherein the paths of the pair of secondary output beams diverge at an angle of about 45° or less.

11. The assembly of claim 1, wherein the information about the optical path difference included in each secondary output beam includes an interferometric phase where the interferometric phases of the secondary output beams have a phase difference of about $\pi$.

12. The assembly of claim 1, further comprising a lens positioned to collimate the initial beams and direct them towards the first polarizing beam splitter.

13. The assembly of claim 12, further comprising a light source configured provide the initial beams to the lens.

14. The assembly of claim 13, further comprising a pair of optical waveguides each positioned to receive a respective polarization component of light emitted from the light source and deliver that component to the lens as one of the initial beams.

15. The assembly of claim 14, wherein an end of each of the optical waveguides is positioned in a focal plane of the lens.

16. The assembly of claim 13, wherein the light source is a homodyne light source.

17. The assembly of claim 13, wherein the light source is a heterodyne light source.

18. The assembly of claim 1, further comprising a lens positioned to receive the pair of secondary output beams and configured to focus the secondary output beams to respective foci.

19. The assembly of claim 18, further comprising a pair of optical waveguides being positioned relative to the lens to respectively receive one of the focused secondary output beams.

20. The assembly of claim 1, wherein the interferometer is a single pass interferometer.

21. The assembly of claim 1, wherein the interferometer is a multiple pass interferometer.

22. The assembly of claim 1, wherein the path of one of the component beams contacts a measurement object remote from the interferometer.

23. The assembly of claim 22, further comprising an electronic controller configured to determine information about the measurement object based on the intensities of the secondary output beams.

24. The assembly of claim 23, wherein the electronic controller determines information based on a difference between the intensities of the secondary output beams.

25. A lithography system for use in fabricating integrated circuits on a wafer, the system comprising:
   a stage for supporting the wafer;
   an illumination system for imaging spatially patterned radiation onto the wafer;
   a positioning system for adjusting the position of the stage relative to the imaged radiation; and
   an interferometry system comprising the assembly of claim 1 for monitoring the position of the wafer relative to the imaged radiation.

26. A lithography system for use in fabricating integrated circuits on a wafer, the system comprising:
   a stage for supporting the wafer; and
   an illumination system including a radiation source, a mask, a positioning system, a lens assembly, and an interferometry system comprising the assembly of claim 1,
   wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

27. A beam writing system for use in fabricating a lithography mask, the system comprising:
   a source providing a write beam to pattern a substrate;
   a stage supporting the substrate;
   a beam directing assembly for delivering the write beam to the substrate;
   a positioning system for positioning the stage and beam directing assembly relative one another; and
   an interferometry system comprising the assembly of claim 1 for monitoring the position of the stage relative to the beam directing assembly.

28. A method for fabricating integrated circuits, the method comprising:
   applying a resist to a wafer;
   forming a pattern of a mask in the resist by exposing the wafer to radiation using the lithography system of claim 25; and
   producing an integrated circuit from the wafer.

29. A method for fabricating integrated circuits, the method comprising:
   applying a resist to a wafer;
   forming a pattern of a mask in the resist by exposing the wafer to radiation using the lithography system of claim 26; and
   producing an integrated circuit from the wafer.

30. A method for fabricating integrated circuits, the method comprising:
   applying a resist to a wafer;
   forming a pattern of a mask in the resist by exposing the wafer to radiation using the lithography system of claim 27; and
   producing an integrated circuit from the wafer.

31. A method for fabricating a lithography mask, the method comprising:
   directing a write beam to a substrate to pattern the substrate;
   positioning the substrate relative to the write beam;
   monitoring the position of the substrate relative to the write beam using an interferometry system comprising the assembly of claim 1; and
   adjusting the relative position between the substrate and the write beam based on the monitored position.

* * * * *